United States Patent [19]
Bogardus et al.

[11] 3,871,067
[45] Mar. 18, 1975

[54] METHOD OF MANUFACTURING A SEMICONDUCTOR DEVICE

[75] Inventors: E. Hal Bogardus, Poughkeepsie; Peter P. Peressini, Wappingers Falls; Timothy M. Reith, Poughkeepsie, all of N.Y.

[73] Assignee: International Business Machines Corporation, Armonk, N.Y.

[22] Filed: June 29, 1973

[21] Appl. No.: 375,278

[52] U.S. Cl. ........................ 29/571, 29/578, 29/590, 148/1.5, 357/90, 357/91
[51] Int. Cl. .............................................. H01l 7/00
[58] Field of Search ....... 250/492 A; 29/576 B, 578, 29/571, 584, 585; 317/235; 148/1.5

[56] References Cited

UNITED STATES PATENTS

| | | | |
|---|---|---|---|
| 3,382,568 | 5/1968 | Kuiper | 29/578 |
| 3,600,797 | 8/1971 | Bower et al. | 29/576 B |
| 3,620,851 | 11/1971 | King et al. | 317/235 |
| 3,682,729 | 8/1972 | Gukelberger et al. | 250/492 A |
| 3,747,203 | 7/1973 | Shannon | 29/578 |

OTHER PUBLICATIONS

Warner, "Integrated Circuits – Design Principles and Fabrication," 1965, pp. 75–78. Motorola-Semiconductor Div.

Richman, "An Introduction to the Science of Metals," 1967, pp. 349–350, Brown University.

*Primary Examiner*—Roy Lake
*Assistant Examiner*—Craig R. Feinberg
*Attorney, Agent, or Firm*—Frank C. Leach, Jr.; Daniel E. Igo; Wesley DeBruin

[57] ABSTRACT

Silicon ions are implanted in an aluminum or aluminum-copper film forming an electrode layer over a silicon dioxide layer on a semiconductor. The per cent by weight of silicon implanted into the metal film is greater than the per cent by weight of solid solubility of silicon in aluminum at the maximum processing temperature of the substrate that occurs after implantation. The peak of the implanted ion profile is preferably at the interface between the film and a silicon dioxide layer on the surface of the substrate.

14 Claims, 4 Drawing Figures

METHOD OF MANUFACTURING A SEMICONDUCTOR DEVICE

In manufacturing semiconductor devices, the problem has existed of silicon of a substrate diffusing into a metal film including aluminum and the aluminum diffusing from the film into the substrate during heat treatment of the substrate such as to form ohmic contact of the metal film with the substrate, for example. If the substrate has a shallow emitter-base junction, for example, this diffusion of aluminum into the substrate during heat treatment has resulted in a shorted device, for example.

One method of overcoming this problem is disclosed in U.S. Pat. No. 3,382,568 to Kuiper. While the method of the aforesaid Kuiper patent is satisfactory in many instances, the method of the present invention enables more precise control of the per cent by weight of silicon in aluminum when such is required, eliminates certain problems inherent in evaporation of silicon, and etching problems resulting from etching a film of aluminum-silicon or aluminum-copper-silicon.

When adding silicon to a metal film including aluminum by evaporation, silicon must be deposited on the metallic film before etching of the film occurs to produce the electrode lands or layers. This is because deposition of silicon on the metal film by evaporation requires deposition over the entire surface of the film to prevent deposition of the silicon on the silicon dioxide layer, for example, over which the metal is deposited.

As a result of the necessity of depositing silicon on the metal film prior to etching, it is necessary to etch the alloy of silicon with aluminum or aluminum-copper to form the metal electrode layers or lands. Difficulties have been encountered in controlling the etching of an alloy of silicon and aluminum or aluminum-copper. In fact, it has sometimes been necessary to utilize a two step etching of a metal film consisting of an alloy of aluminum, copper, and silicon. The two step process has been required for complete removal of silicon.

The present invention satisfactorily solves the foregoing problems through implanting silicon ions of high purity in a metal film of aluminum or aluminum-copper. Since the implantation of the ions can be selectively masked in various areas, the aluminum or aluminum-copper film can be etched prior to implantation of the silicon ions in the metal film. As a result, the problem of etching an alloy of silicon with aluminum or aluminum-copper is eliminated. This also results in reducing the cost since the two step etching of aluminum-copper-silicon film is eliminated as are the control problems for etching silicon.

Additionally, when depositing silicon on a metal film of aluminum or aluminum-copper by evaporation of silicon, silicon has a very low vapor pressure in comparison with aluminum. Accordingly, to evaporate silicon at a commercially feasible rate, it is necessary to heat the evaporation source to a much higher temperature than for evaporating aluminum, for example. As a result, outgassing is produced by these higher temperatures whereby sodium ions can enter the metal film and the silicon dioxide layer.

While mobile ions such as sodium ions do not present any problem with bipolar transistors, the presence of mobile ions such as sodium ions, for example, in a field effect transistor produces threshold voltage instability and parasitic leakage between devices on the same chip. Therefore, if one wishes to obtain a commercially feasible deposition rate of silicon by evaporation, the relatively high temperature required makes more difficult the deposition of silicon on a metal film of aluminum or aluminum-copper when the semiconductor device is to be a field effect transistor.

Additionally, evaporating silicon to deposit it on the film of aluminum or aluminum-copper creates other difficulties. These include cracking of the crucible, reactivity of silicon with oxygen, and filament burn-out, for example. These difficulties increase the cost of processing semiconductor devices in which silicon is added to a metal film of aluminum or aluminum-copper to have the per cent by weight of silicon in aluminum exceed the per cent by weight of solid solubility of silicon in aluminum at the maximum processing temperature to which the device is subjected after deposition of silicon.

Since silicon is deposited in the metal film by ion implantation in the method of the present invention, the difficulties associated with evaporation of silicon are eliminated. As a result, the process is FET clean so that it may be readily employed in manufacturing field effect transistors.

In the aforesaid Kuiper patent, the per cent by weight of silicon in aluminum is in the range of two to three per cent. However, the solid solubility of silicon in aluminum is 0.3% by weight at 400° C., 0.6% by weight of 450° C., and 0.8% by weight at 500° C. Since the maximum realistic processing temperature for semiconductor devices after depositing silicon in the metal film is 400° C. (This is for ohmic contact of the metal.) because of glassing by sputtered quartz at 360° C. to 380° C., only 0.3% by weight of silicon in aluminum is required. Accordingly, the present invention enables the per cent by weight of silicon in aluminum to be only that required to prevent diffusion.

Additionally, the present invention is particularly useful with very thin films. For example, with an aluminum film of one micron, a silicon film of only 30 A would be needed with the evaporation technique to have the required 0.3% by weight of silicon in the aluminum film. This is an uncontrollably small amount of silicon to evaporate. Thus, the evaporation of silicon does not lend itself readily to use with a very thin film of aluminum and a very low per cent by weight of silicon in aluminum.

With ion implantation, a precise quantity of silicon can be added. Thus, the method of the present invention enables only 0.3% by weight of silicon to aluminum to be added to a film of aluminum or aluminum-copper. Accordingly, the precise control of the amount of silicon in the metal film enables use with a very thin film of aluminum or aluminum-copper.

When depositing silicon with aluminum or aluminum-copper by evaporation of silicon, the grain growth characteristics of the film can be affected. As a result, electromigration resistance of an aluminum-silicon or aluminum-copper-silicon film can be affected.

Since implantation of silicon ions in the film of aluminum or aluminum-copper occurs after the film is grown, there is no disturbing of the grain structure of the film of aluminum or aluminum-copper as occurs when evaporating silicon at a relatively high temperature with aluminum or aluminum-copper. Thus, there is no degradation of electromigration resistance of an implanted aluminum-silicon film or an implanted aluminum-copper-silicon film in comparison with such films formed by evaporating silicon.

While the maximum diffusion of aluminum into silicon and silicon into aluminum occurs at the aluminum-silicon interface, this is due to the absence of silicon in the silicon dioxide layer for diffusion into aluminum. Thus, it would be desired to be able to have the maximum percent by weight of silicon in the film at this interface of the aluminum and the silicon dioxide layer.

The method of the present invention is capable of controlling the peak of the implanted profile of the ions with the peak of the implanted profile producing the maximum weight of silicon in the metal film. Accordingly, through controlling the energy level at which the silicon ions are implanted in the film of aluminum or aluminum-copper, the position of the peak of the profile of the implanted silicon ions is controlled. Therefore, the maximum weight can be positioned at the interface of the metal film with the silicon dioxide layer on the substrate and the interface of the metal film with the substrate to produce more effective prevention of penetration of aluminum into the silicon substrate.

One method of forming interconnect metallization has been to utilize an electron beam. This is done by a lift-off technique. After the photoresist is exposed and developed, aluminum is deposited over the photoresist and the developed areas by evaporation. Because of the shape of the developed areas produced in the photoresist by the electron beam, the metal within the developed area is disconnected from the metal on top of the photoresist during deposition of the metal. Therefore, the removal of the photoresist removes the excess metal. This produces rather sharp lines.

However, if silicon is evaporated for deposition on the aluminum film in the developed areas, the high temperature required to evaporate silicon to obtain a feasible rate of deposition because of silicon's low vapor pressure can cause the photoresist to melt since it starts to flow at approximately 100° C. As a result, the lands or layers of aluminum would not be sharp. The method of the present invention eliminates this problem since it occurs at a relatively low temperature such as room temperature, for example.

An object of this invention is to provide a method to prevent penetration of a metal into a semiconductor substrate during processing at relatively high temperatures.

Another object of this invention is to provide a method to prevent penetration of aluminum into a silicon substrate during processing at relatively high temperatures.

A further object of this invention is to provide a method of forming a semiconductor device to prevent shorting of semiconductor junctions by the metal conductors.

The foregoing and other objects, features, and advantages of the invention will be more apparent from the following more particular description of a preferred embodiment of the invention, as illustrated in the accompanying drawing.

Figure 1:
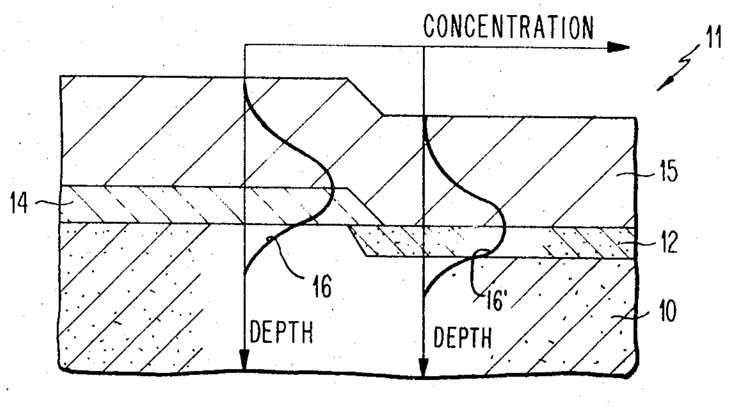
FIG. 1 is a schematic diagram showing the profile of the concentration of silicon in a semiconductor device manufactured by the method of the present invention.

Referring to FIG. 1, there is shown a substrate 10 of silicon of a semiconductor device 11. The substrate 10 is of one conductivity type so as to form a base of a transistor, for example, with an emitter 12 formed in the surface of the substrate 10 by any suitable means such as diffusion of an impurity of the opposite conductivity type into the substrate 10, for example. This diffusion occurs through an opening in a layer 14 of silicon dioxide, for example. A metal film 15 of aluminum or aluminum-copper is deposited over the substrate 10.

The profile of implantation of silicon ions in the semiconductor device 11 is shown by curves 16 and 16'. The peak of the profile in the portion of the device 11 having the silicon dioxide layer 14 is at the interface of the metal film 15 with the silicon dioxide layer 14. In the portion of the device 11 in which the metal film 15 contacts the emitter 12, the peak of the profile is at the aluminum-silicon interface.

The profile, defined by the curves 16 and 16', is determined by the energy level to which the silicon ions are subjected. Thus, an increase in the energy level pushes the peak of the curves 16 and 16' further into the semiconductor device 11. Therefore, the energy level of implantation of the silicon ions is preferably selected so that the peak of the curve 16 occurs at the interface of the film 15 with the layer 14 of silicon dioxide and the peak of the curve 16' occurs at the interface of the film 15 with the emitter 12. This prevents penetration of aluminum from the film 15 into the silicon substrate 10 since the aluminum in the film 15 above the silicon dioxide layer 14 does not draw silicon atoms from the substrate 10 due to the implanted silicon ions in the film 15.

The concentration of silicon in the film 15 is determined by the dosage. That is, for a given film thickness, as the dosage increases, the per cent by weight of silicon in aluminum in the film 15 increases. Therefore, it is only necessary to select the dosage that will produce the desired per cent by weight of silicon in aluminum in the film 15 in accordance with the thickness of the film 15. Thus, as the thickness of the film 15 increases, it is necessary to increase the dosage to have the same per cent by weight of silicon in aluminum.

The per cent by weight of silicon in aluminum in the film 15 is selected to be greater than the per cent by weight of solid solubility of silicon in aluminum at the maximum temperature at which processing of the semiconductor device 11 occurs.

As the curves 16 and 16' indicate, all of the silicon ions are implanted in the semiconductor device 11. This is insured through selecting the energy level of implantation.

Figure 2:
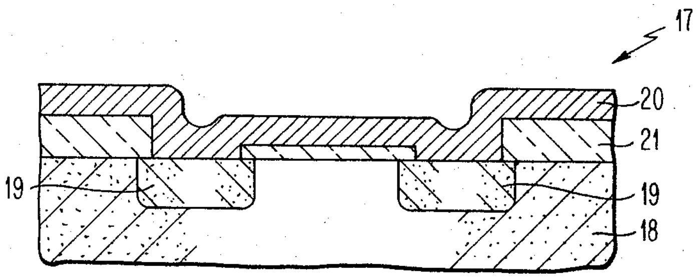
FIG. 2 is a fragmentary sectional view of the field effect transistor having an aluminum film.
Figure 3:
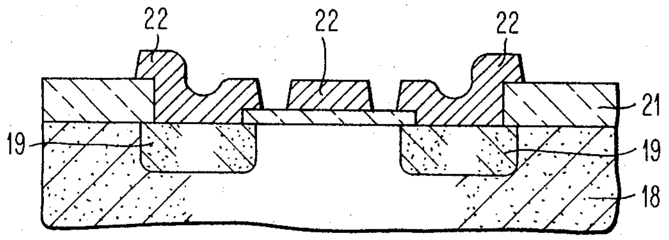
FIG. 3 is a fragmentary sectional view of the field effect transistor of FIG. 2 with the aluminum etched to form electrode layers.
Figure 4:
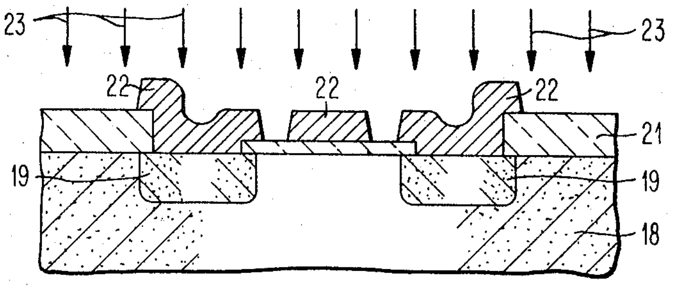
FIG. 4 is a sectional view, similar to FIG. 3, showing ion implantation in the electrode layers.

The processing of a field effect transistor 17 by the method of the present invention is shown in FIGS. 2, 3, and 4. The field effect transistor 17 has a silicon substrate 18 with regions 19 of opposite conductivity type formed therein by any suitable means. A metal film 20 of aluminum or aluminum-copper is deposited over a silicon dioxide layer 21 of the substrate 18 as shown in FIG. 2.

After deposition of the film 20 of aluminum or aluminum-copper, etching of the film 20 occurs with a suitable etchant to form metal electrode layers or lands 22 as shown in FIG. 3. Then, silicon ions are implanted into the metal electrode layers 22 by implantation as indicated by arrows 23 in FIG. 4. It is not necessary to use a mask to control the areas to which the ions are directed since the energy level can be controlled so that the ions will not penetrate the silicon substrate 18 if it is desired to prevent such.

Tests have been conducted to determine the feasibility of the process of this invention. One wafer was fabricated with N-P diodes having emitter-base junctions of $19 \times 10^{-6}$ inch. Each of the emitter-base junctions was formed by diffusing arsenic to produce a surface concentration of $1 \times 10^{20}$ atoms/cm$^3$.

A silicon dioxide layer of about 5,000 A was thermally grown over the surface of each of the wafers having the emitter-base junctions. Then, holes were etched in the silicon dioxide layer over the emitters.

An aluminum film with a thickness of 5,000 A was deposited over the silicon dioxide layer for contact with the emitters and the silicon dioxide layer. Implantation of silicon ions was made after etching the aluminum film to form metal electrode layers.

The wafer had four different types of metallization patterns. Each of the four patterns is considered a different device number with 25 devices originally constituting each device number.

A dosage of $1.5 \times 10^{16}$ silicon atoms/cm$^2$ was then implanted into the aluminum film at an energy of 180 keV to achieve approximately 0.5% by weight of silicon in aluminum.

Since the solid solubility of silicon in aluminum is 0.3% by weight of 400° C., 0.6% by weight at 450° C., and 0.8% by weight at 500° C., all devices subjected to temperatures of only 400° C. should have no shorts. Devices subjected to temperatures of 450° C. should have some shorts while devices subjected to 500° C. should all be shorted.

The tests verified this as shown hereinafter wherein the devices on one portion of the wafer, which was cut into portions after implantation, were subjected to temperatures of 400° C. for both one hour and three hours with all devices being good. When other of the devices on another portion of the wafer were subjected to 450° C. for one hour and three hours, all the devices were not good, but most of them were. None of the devices, which were on a third portion of the wafer, was good when subjected to 500° C. for one hour.

While some of the device numbers have less than 25, this is because the devices were tested prior to heat treatment and some were already shorted. Thus, only those which were not shorted prior to heat treatment were tested after silicon implantation.

Two control wafers, which were identical to the wafer subjected to the ion implantation except that one had an emitter-base junction of $42 \times 10^{-6}$ inch rather than $19 \times 10^{-6}$ inch, also were tested. These wafers had no silicon ions implanted. As shown hereinafter, the subjecting of the devices to a temperature of 400° C. for one hour produced shorts in all of the devices. By increasing the thickness of the junction depth to $42 \times 10^{-6}$ inch, a temperature of 400° C. for one hour did not always cause a short. In fact, device No. 1 was good in all instances. Similarly, when subjecting junctions of this depth to 400° C. for three hours, there were some good devices.

Each of the two control wafers also had some of the devices shorted prior to testing. This is why there are not twenty-five devices for each of the device numbers.

Furthermore, when testing at the same temperature for more than one period of time, it should be understood that the same devices were tested. That is, when tested at 400° C. for one and three hours, for example, the devices were removed to room temperature after one hour at 400° C. and tests made to determine whether any were shorted. Then, heating of the same devices continued for two more hours at 400° C. for a total of three hours to obtain the duration of three hours for testing.

This test data shows that implantation of silicon ions produces all good devices with very shallow juctions. While junctions having relatively large depths may not require the method of the present invention, the tests show that the devices may not always be satisfactory even with the relatively large depth junction.

SILICON ION IMPLANTED WAFER

| Device No. | Junction Depth $10^{-6}$ inch | Temp. ° C. | Time Hours | Number Good | Total Number | % Good |
|---|---|---|---|---|---|---|
| 1 | 19 | 400 | 1 | 23 | 23 | 100 |
| 2 | 19 | 400 | 1 | 25 | 25 | 100 |
| 3 | 19 | 400 | 1 | 24 | 24 | 100 |
| 4 | 19 | 400 | 1 | 24 | 24 | 100 |
| 1 | 19 | 400 | 3 | 23 | 23 | 100 |
| 2 | 19 | 400 | 3 | 25 | 25 | 100 |
| 3 | 19 | 400 | 3 | 24 | 24 | 100 |
| 4 | 19 | 400 | 3 | 24 | 24 | 100 |
| 1 | 19 | 450 | 1 | 23 | 25 | 92 |
| 2 | 19 | 450 | 1 | 21 | 24 | 88 |
| 3 | 19 | 450 | 1 | 23 | 24 | 96 |
| 4 | 19 | 450 | 1 | 21 | 25 | 84 |
| 1 | 19 | 450 | 3 | 23 | 25 | 92 |
| 2 | 19 | 450 | 3 | 21 | 24 | 88 |
| 3 | 19 | 450 | 3 | 23 | 24 | 96 |
| 4 | 19 | 450 | 3 | 21 | 25 | 84 |
| 1 | 19 | 500 | 1 | 0 | 24 | 0 |
| 2 | 19 | 500 | 1 | 0 | 25 | 0 |
| 3 | 19 | 500 | 1 | 0 | 25 | 0 |
| 4 | 19 | 500 | 1 | 0 | 25 | 0 |

CONTROL WAFERS (NO IMPLANTED SILICON IONS)

| Device No. | Junction Depth $10^{-6}$ inch | Temp. ° C. | Time Hours | Number Good | Total Number | % Good |
|---|---|---|---|---|---|---|
| 1 | 19 | 400 | 1 | 0 | 20 | 0 |
| 2 | 19 | 400 | 1 | 0 | 21 | 0 |
| 3 | 19 | 400 | 1 | 0 | 22 | 0 |
| 4 | 19 | 400 | 1 | 0 | 23 | 0 |
| 1 | 42 | 400 | 1 | 23 | 23 | 100 |
| 2 | 42 | 400 | 1 | 22 | 23 | 96 |
| 3 | 42 | 400 | 1 | 7 | 23 | 30 |
| 4 | 42 | 400 | 1 | 8 | 25 | 32 |
| 1 | 42 | 400 | 3 | 17 | 23 | 74 |
| 2 | 42 | 400 | 3 | 8 | 23 | 35 |
| 3 | 42 | 400 | 3 | 0 | 23 | 0 |
| 4 | 42 | 400 | 3 | 0 | 25 | 0 |

While the tests were related to silicon ions being implanted in aluminum, it should be understood that the same results would be obtained with an aluminum-copper film as long as the per cent by weight of silicon in aluminum was controlled accordingly. Furthermore, although the present invention has discussed the substrate as being silicon and the film as being aluminum or aluminum-copper, it should be understood that the substrate could be formed of any other semiconductor material which would have solid solubility with aluminum. Similarly, the present invention could be utilized with any other metal film having a metal that has solid solubility with silicon or other semiconductor materials.

While the present invention has described the insulating material as silicon dioxide, it should be understood that any other suitable insulating material could be employed. While the metallization has been described as being removed by etching, it should be understood that any other suitable means for removing the metallization could be utilized.

While the present invention has shown and described the peak of the profile of the implanted ions as preferably being at the interface of the metal film with the insulating layer or the substrate, it should be understood that the peak of the profile must be located within the metal film. Furthermore, in certain applications, it may be necessary to control the implantation of the ions so that none of the ions reach the substrate.

An advantage of this invention is that it eliminates the etching problem inherent in an alloy of aluminum-silicon or aluminum-copper-silicon. Another advantage of this invention is that it avoids the difficulties associated with evaporation of silicon. A further advantage of this invention is that precise control of the per cent by weight of silicon in aluminum in a film including aluminum is obtained. Still another advantage of this invention is that location of the maximum amount of silicon in the film can be controlled so that the maximum amount of silicon is at the interface of the film with the layer of silicon dioxide. Still another advantage of this invention is that it is particularly useful with the electron beam lift-off technique. A still further advantage of this invention is that it is FET clean. Yet another advantage of this invention is that pure silicon is deposited in the metal film. A yet further advantage of this invention is that it does not affect the grain structure of the film.

While the invention has been particularly shown and described with reference to a preferred embodiment thereof, it will be understood by those skilled in the art that various changes in form and details may be made therein without departing from the spirit and scope of the invention.

What is claimed is:

1. A method of manufacturing a semiconductor device having a substrate of a semiconductor material with an insulating layer thereon and a metal film overlying the insulating layer and in contact with at least one portion of the substrate to form an electrode layer including the steps of implanting ions of the semiconductor material into the metal film to form a concentration profile of the implanted ions having a peak, selecting the maximum temperature to which the metal film is to be subjected during further processing, selecting the dosage of the ions to produce a per cent by weight of the semiconductor material in one material of the metal film that is greater than the per cent by weight of solid solubility of the semiconductor material in the one material of the metal film at the maximum temperature to which the metal film is to be subjected during further processing to prevent the one material of the metal film from diffusing into the semiconductor material during further processing at a temperature no greater than the maximum temperature, and controlling the energy level of the ions to position the peak of the profile of the implanted ions no deeper than the interfaces of the metal film with the insulating layer and the metal film with the substrate.

2. The method according to claim 1 in which the semiconductor material is silicon and the metal film includes at least aluminum with aluminum being the one material.

3. The method according to claim 2 in which the metal film comprises only aluminum as the metal with aluminum being the one material.

4. The method according to claim 3 in which the energy level of the ions is controlled to position the peak of the profile of the implanted ions at the interfaces of the metal film with the insulating layer and the metal film with the substrate.

5. The method according to claim 4 including removing portions of the metal film to form at least one electrode layer prior to implantation of the ions in the metal film.

6. The method according to claim 2 in which the metal film includes aluminum and copper with aluminum being the one material.

7. The method according to claim 6 in which the energy level of the ions is controlled to position the peak of the profile of the implanted ions at the interfaces of the metal film with the insulating layer and the metal film with the substrate.

8. The method according to claim 7 including removing portions of the metal film to form at least one electrode layer prior to implantation of the ions in the metal film.

9. The method according to claim 2 in which the energy level of the ions is controlled to position the peak of the profile of the implanted ions at the interfaces of the metal film with the insulating layer and the metal film with the substrate.

10. The method according to claim 9 including removing portions of the metal film to form at least one electrode layer prior to implantation of the ions in the metal film.

11. The method according to claim 1 in which the energy level of the ions is controlled to position the peak of the profile of the implanted ions at the interfaces of the metal film with the insulating layer and the metal film with the substrate.

12. The method according to claim 11 including removing portions of the metal film to form at least one electrode layer prior to implantation of the ions in the metal film.

13. The method according to claim 1 including removing portions of the metal film to form at least one electrode layer prior to implantation of the ions in the metal film.

14. The method according to claim 1 in which the semiconductor device is a field effect transistor.

* * * * *